(12) United States Patent
Koch et al.

(10) Patent No.: US 9,171,838 B2
(45) Date of Patent: Oct. 27, 2015

(54) INTEGRATED SEMICONDUCTOR DEVICE

(71) Applicant: SONY CORPORATION, Tokyo (JP)

(72) Inventors: Stefan Koch, Oppenweiler (DE); Thomas Merkle, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/414,941

(22) PCT Filed: Aug. 1, 2013

(86) PCT No.: PCT/EP2013/066209
§ 371 (c)(1),
(2) Date: Jan. 15, 2015

(87) PCT Pub. No.: WO2014/026858
PCT Pub. Date: Feb. 20, 2014

(65) Prior Publication Data
US 2015/0179634 A1 Jun. 25, 2015

(30) Foreign Application Priority Data
Aug. 14, 2012 (EP) .................... 12180379

(51) Int. Cl.
*H01L 29/76* (2006.01)
*H01L 29/94* (2006.01)
*H01L 27/06* (2006.01)
*H01L 23/522* (2006.01)
*H01L 49/02* (2006.01)

(52) U.S. Cl.
CPC ........ *H01L 27/0629* (2013.01); *H01L 23/5226* (2013.01); *H01L 28/20* (2013.01)

(58) Field of Classification Search
CPC ................ H01L 2924/00; H01L 28/20; H01L 2924/1306

USPC .................... 257/379–380; 438/210
See application file for complete search history.

(56) References Cited

U.S. PATENT DOCUMENTS

| | | | |
|---|---|---|---|
| 5,021,859 A | 6/1991 | Ito et al. | |
| 5,578,860 A | 11/1996 | Costa et al. | |
| 5,869,381 A | 2/1999 | Hebert et al. | |
| 6,127,892 A | 10/2000 | Komurasaki et al. | |
| 7,863,654 B2* | 1/2011 | Lin | 257/211 |
| 7,875,933 B2* | 1/2011 | Schneider et al. | 257/355 |
| 8,008,716 B2 | 8/2011 | Lui et al. | |
| 2007/0108533 A1 | 5/2007 | Sekiguchi et al. | |
| 2008/0093706 A1 | 4/2008 | Sato et al. | |

FOREIGN PATENT DOCUMENTS

EP 1 912 251 4/2008

OTHER PUBLICATIONS

International Search Report issued Oct. 25, 2013 in PCT/EP13/066209 filed Aug. 1, 2013.
Chi, C., et al., "An X-band GaN combined solid-state power amplifier", Journal of Semiconductors, vol. 30, No. 9, pp. 095001-1-095001-5, Sep. 2009.
Post, J. E., "Resistive Loading Enhances LNA Stability", Journal Library, Microwave & RF, (15 pages), Dec. 2005.

* cited by examiner

*Primary Examiner* — Theresa T Doan
(74) *Attorney, Agent, or Firm* — Oblon, McClelland, Maier & Neustadt, L.L.P.

(57) ABSTRACT

An integrated semiconductor device having a stabilization function includes a substrate layer, an insulating layer, ground plane layer formed between the substrate layer and the insulating layer and a signal plane layer formed on a surface of the insulating layer facing away from the substrate layer. An n-port, e.g. a transistor, is formed within the substrate layer on a first side of the substrate layer. A via hole is formed through the insulating layer. A resistor is formed within the ground plane layer.

12 Claims, 11 Drawing Sheets

INTEGRATED SEMICONDUCTOR DEVICE

CROSS-REFERENCE TO RELATED APPLICATIONS

The present application claims priority to European Patent Application 12180379.5, filed in the European Patent Office on Aug. 14, 2012, the entire contents of which being incorporated herein by reference.

BACKGROUND

1. Field of the Disclosure

The present disclosure relates to an integrated semiconductor device having a stabilization function, in particular for use in or as a high frequency amplifier.

2. Description of Related Art

For amplifier circuits, stabilization is generally one key factor for correct functionality. Stabilization is typically realized by adding resistance into the drain-side matching circuitry of a transistor or MOSFET (metal-oxide-semiconductor field-effect transistor), for instance for low noise amplifiers. However, such measures for stabilization generally introduce a voltage drop to the biasing voltage of the transistor which depends on the bias current and the resistor value itself. This means that e.g. for modulated input signals, the voltage drop is also modulated and therefore time-dependent in addition. This degrades further the nonlinear behavior of the amplifier.

Stabilization of solid state power amplifiers is described in Chen Chi et al., "An X-band GaN combined solid-state power amplifier", Semiconductors (2009), Volume: 30, Issue: 9, Pages: 095001-1 to 095001-5.

A RF power transistor having an improved stability and gain is disclosed in U.S. Pat. No. 5,869,381 A. A resistive emitter ballasting by including integrated capacitive elements in parallel with the resistive elements in the emitter circuit is proposed in this document.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present invention.

SUMMARY

It is an object to provide an integrated semiconductor device that has the desired stabilization function but avoids the introduction of voltage drops and that has a simple design that can be easily manufactured.

According to an aspect there is provided an integrated semiconductor device comprising a substrate layer, an n-port, n being an integer equal to or larger than 2, having a first port terminal, a second port terminal and a ground terminal, said n-port being formed within said substrate layer on a first side of said substrate layer, an insulating layer formed on a surface on said first side of said substrate layer, a ground plane layer formed between said substrate layer and said insulating layer, said ground plane layer being in contact with one terminal of said n-port, a signal plane layer formed on a surface of said insulating layer facing away from said substrate layer, a via hole formed through said insulating layer and electrically contacting said signal plane layer with another terminal of said n-port than said ground plane layer, a terminal formed within said insulating layer and electrically contacting said terminal of said n-port that is neither in contact with said ground plane layer nor with said signal plane layer, and a resistor formed within said ground plane layer.

One of the aspects of the disclosure is to provide a resistor within the ground plane and not, as conventionally, in the signal plane layer. Thus, the resistor affects the electrical (RF−) field by introducing losses for the electromagnetic field (RF). Therefore, the desired stability criteria can be achieved for e.g. amplifier circuits using the proposed integrated semiconductor device.

Preferably, the n-pole is a two-pole or a three-pole and comprises a transistor. Said transistor is preferably a MOS transistor but generally any FET (field effect transistor) can be used as transistor in the proposed semiconductor device and can benefit from the proposed stabilization technique. Such other transistors include e.g. HEMTs (high electron mobility transistors) and MESFETs (metal semiconductor field effect transistors). Furthermore, bipolar transistors can be used in the proposed semiconductor device also. Further, the n-pole may comprise other elements than transistors like capacitors, inductors or other active elements It is to be understood that both the foregoing general description of the invention and the following detailed description are exemplary, but are not restrictive, of the invention.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
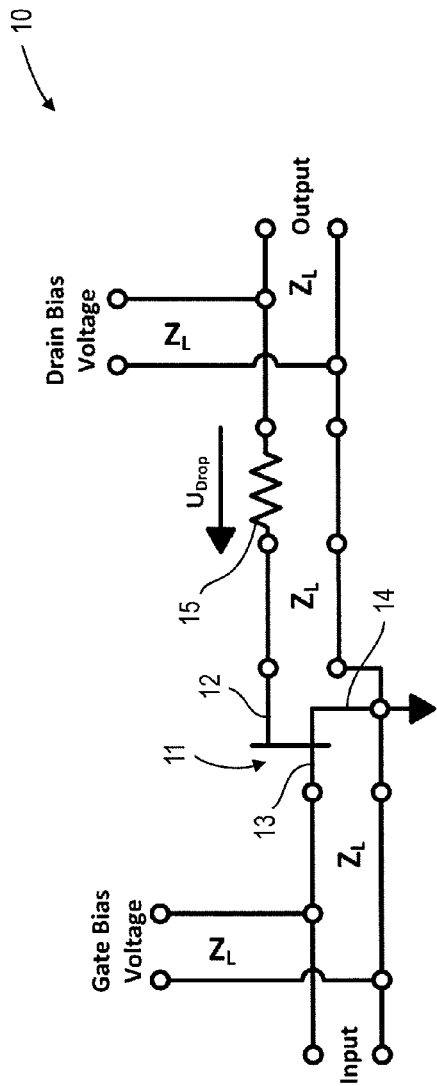
FIG. 1 shows a circuit diagram of a conventional single stage amplifier.

Referring now to the drawings, wherein like reference numerals designate identical or corresponding parts throughout the several views, FIG. 1 shows a circuit diagram of a conventional single stage amplifier 10 with drain/output stabilization. The amplifier 10 comprises a transistor 11, in this embodiment a MOS transistor as an example, having a drain 12, a gate 13 and a source 14. The source 14 is connected to ground in the depicted common source configuration. Between drain 12 and source 14 a drain bias voltage is provided. Between gate 13 and source 14 a gate bias voltage is provided.

For any kind of amplifier circuitry, stabilization is one key factor for correct functionality. Stabilization is typically realized by adding resistance (resistor 15) into the drain-side matching circuitry (e.g. for low noise or power amplifiers). The drawback of such a stabilization method is that a voltage drop ($U_{Drop}$) is introduced to the biasing voltage of the transistor 11 which depends on the bias current and the resistor value. This means that for modulated input signals, the voltage drop is also modulated and therefore time-dependent. This degrades further the nonlinear behavior of the amplifier 10.

Figure 2:
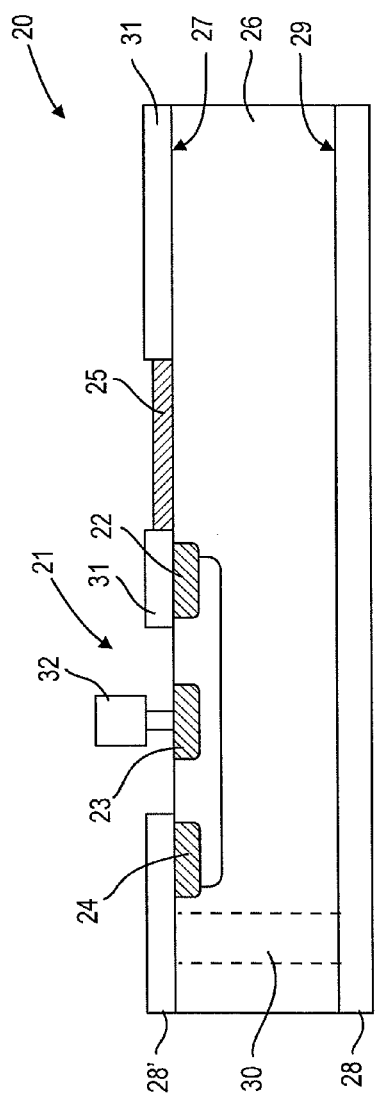
FIG. 2 shows a cross section of a first implementation of the amplifier shown in FIG. 1.

One embodiment for the realization of such a circuit 10 is described with reference to FIG. 2 showing a cross-sectional view of a conventional (partly) integrated amplifier 20 using a conventional transmission line type. It comprises a transistor 21 having a drain 22, a gate 23 and a source 24, which is formed within a substrate layer 26 on a first side 27 of said substrate layer 26. A first part 28 of a ground plane layer is formed on a second side 29 of said substrate layer 26 opposite the first side 27. Further, another part 28' of the ground plane layer is formed on the first side 27 of the substrate layer 26. The two parts 28, 28' of the ground plane layer are electrically connected through a via hole 30 formed through said substrate layer 26. The upper part 28' of the ground plane layer is electrically connected to the source 24 of the transistor 21. A signal plane layer 31 is formed on the first side 27 of said substrate layer 26 and is electrically connected to the drain 22 of the transistor 21. A gate terminal 32 is electrically connected to the gate 23 of the transistor 21. Finally, a resistor 25 is formed within said signal plane layer 31.

As the circuitry later on is typically attached to a "metal holder" or package, all components (transistors, resistors, capacitors (not shown)) are located on the topside of the substrate layer. For integrated circuits (IC) there is even no choice than that the circuit elements are on top of the substrate (due to process technology). The embodiment shown in FIG. 2 uses a "classical" transmission line technology which means that the electrical field is guided in-between the signal plane layer 31 and the ground plane layer 28 through the substrate layer 26. It is clear that the resistor 25 interrupts the transmission line and so causes a voltage drop on the signal line 31 (=signal plane layer).

Figure 3:
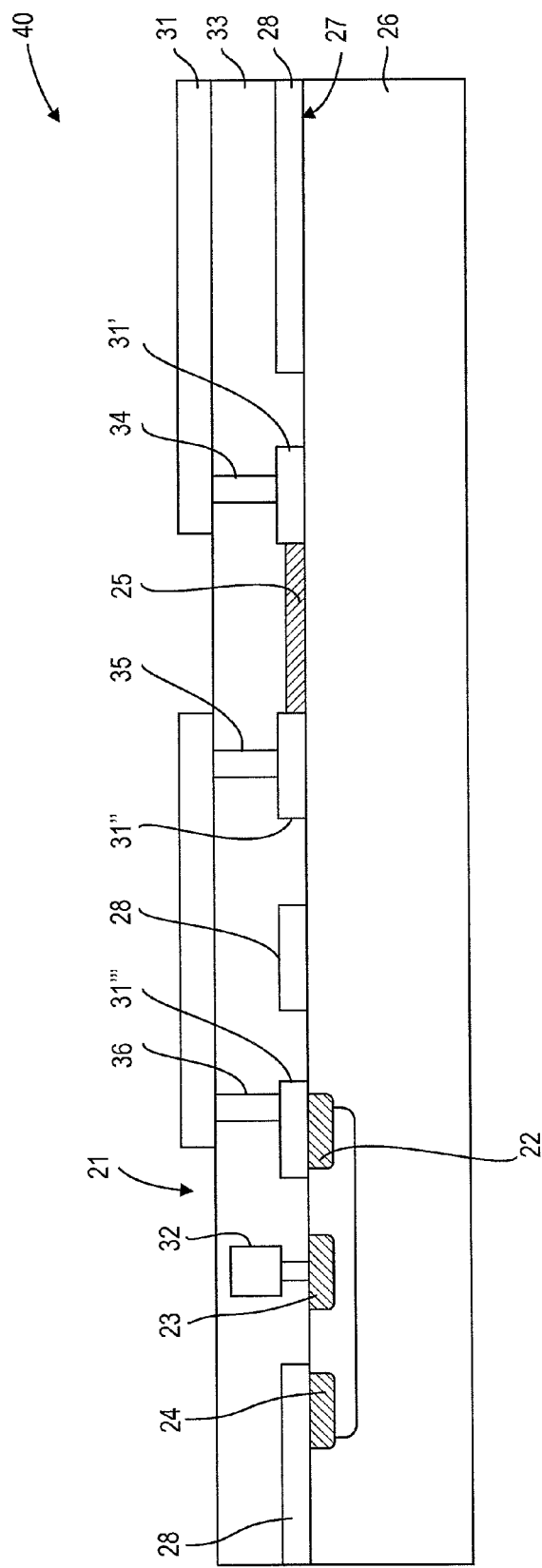
FIG. 3 shows a cross section of a second implementation of the amplifier shown in FIG. 1.

Another embodiment for the realization of the circuit 10 is described with reference to FIG. 3 showing a cross section view of a conventional (partly) integrated amplifier 40 using a front side transmission line type. In comparison to the embodiment shown in FIG. 2, all the circuitry is placed on top of the substrate layer 26 which acts only as "carrier" and no longer as a waveguide for the electromagnetic wave. The guiding of the electromagnetic wave is done on top of the substrate layer in-between the signal plane layer 31 and the ground plane layer 28, separated by an insulating layer 33, in particular a dielectric layer (e.g. BCB (Benzocyclobutene)).

To realize a resistive load (i.e. the resistor 25), the signal line 31 is interrupted and connected via a via hole 34 to the resistor level and back again to the signal line via another via hole 35. Thus, adjacent to the resistor 25 further parts 31', 31" of the signal line are provided on the surface 27 of the substrate layer 26. Another via hole 36 through the insulating layer 33 is provided to contact the signal plane layer 31 to the drain 22 via another part 31''' of the signal plane layer. This is a typical scenario, as the resistor level is different compared to the signal level.

For this configuration there are some severe drawbacks. To avoid shortage between signal plane layer 31 and ground plane layer 28, the resistor 25 is electrically isolated from the ground plane layer 28. Therefore an aperture for the electromagnetic field is created and so energy can be emitted into the substrate. This would cause degradation of the circuitry.

Further, due to the different levels of the resistor 25 and the parts of the signal plane layer 31, 31', 31", 31''', via holes 34, 35, 36 have to connect them to achieve connectivity. This introduces parasites for the resistor 25 and degrades the circuit performance also.

Due to design rules, via holes 34, 35, 36 and resistor size have limitations in size and so in value. This limits mainly the lowest achievable resistor value. For this reason too much resistance must be accepted compared to what would be needed for optimum circuit performance which yields to e.g. unwanted gain losses in amplifiers or to output power losses as operating voltage for the transistor drops more than necessary.

Figure 4:
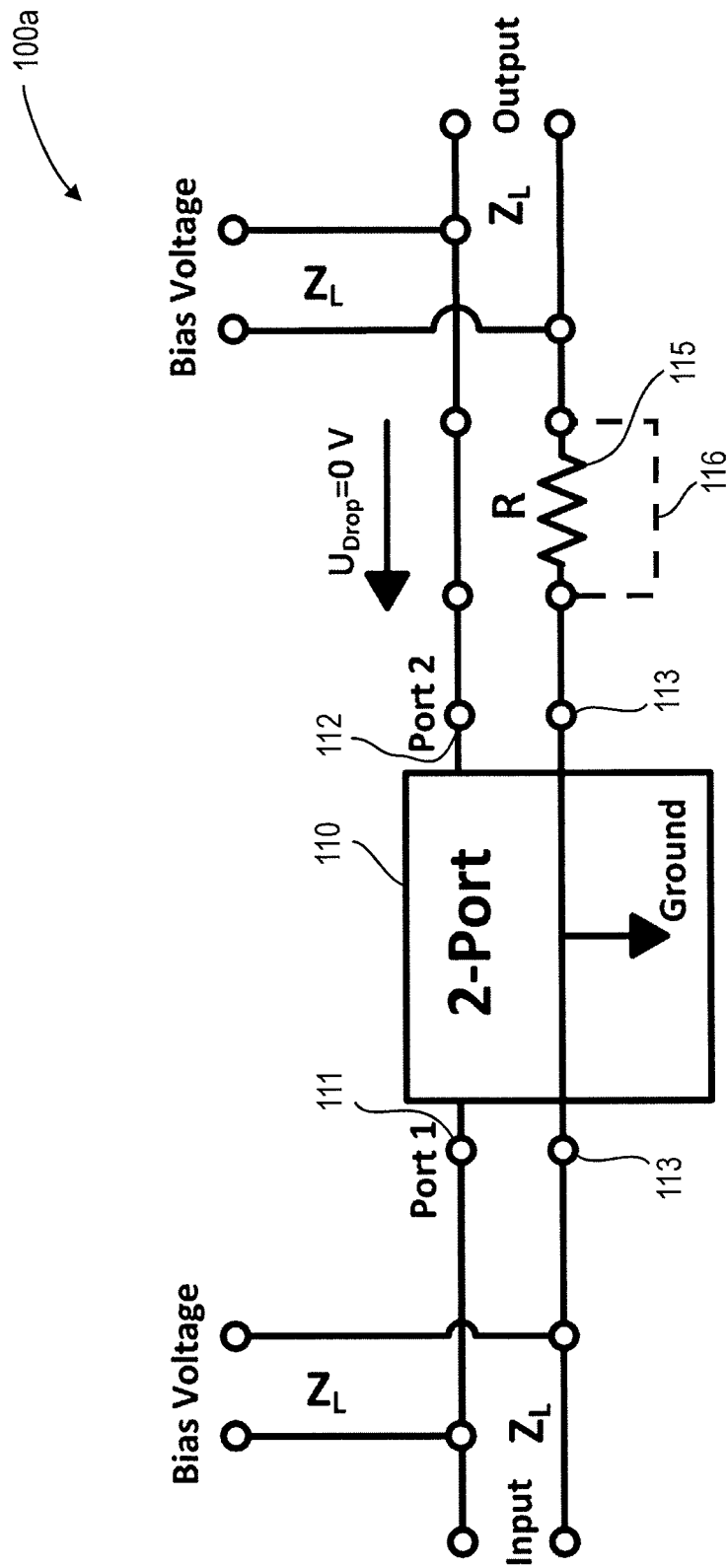
FIG. 4 shows a circuit diagram of a first embodiment of the proposed integrated semiconductor device including a two-port.

To overcome the above illustrated problems an integrated semiconductor circuit 100a, as shown as a first embodiment in FIG. 4, is proposed. The circuit 100a comprises a two-port 110 (generally an n-port, n being an integer equal to or larger than 2) having a first port terminal 111, a second port terminal 112 and a ground terminal 113. Between the first port terminal 111 and the ground terminal 113 a first bias voltage is provided. Between the second port terminal 112 and the ground terminal 113 a second bias voltage is provided. However, contrary to the circuit 10 shown in FIG. 1 the resistor 115 is placed in the ground plane and affects the electrical field by introducing losses for the electromagnetic field. Therefore stability criteria can be achieved for e.g. amplifier circuits. The resistor 115 is by-passed by a DC by-pass 116 formed by part of the ground plane (e.g. ground plane metal) to overcome voltage drop. As the ground plane material is generally distributed over the whole circuit only the "metal losses" of the signal line affects the transistor biasing. No additional voltage drop is introduced due to stabilization actions.

Figure 5:
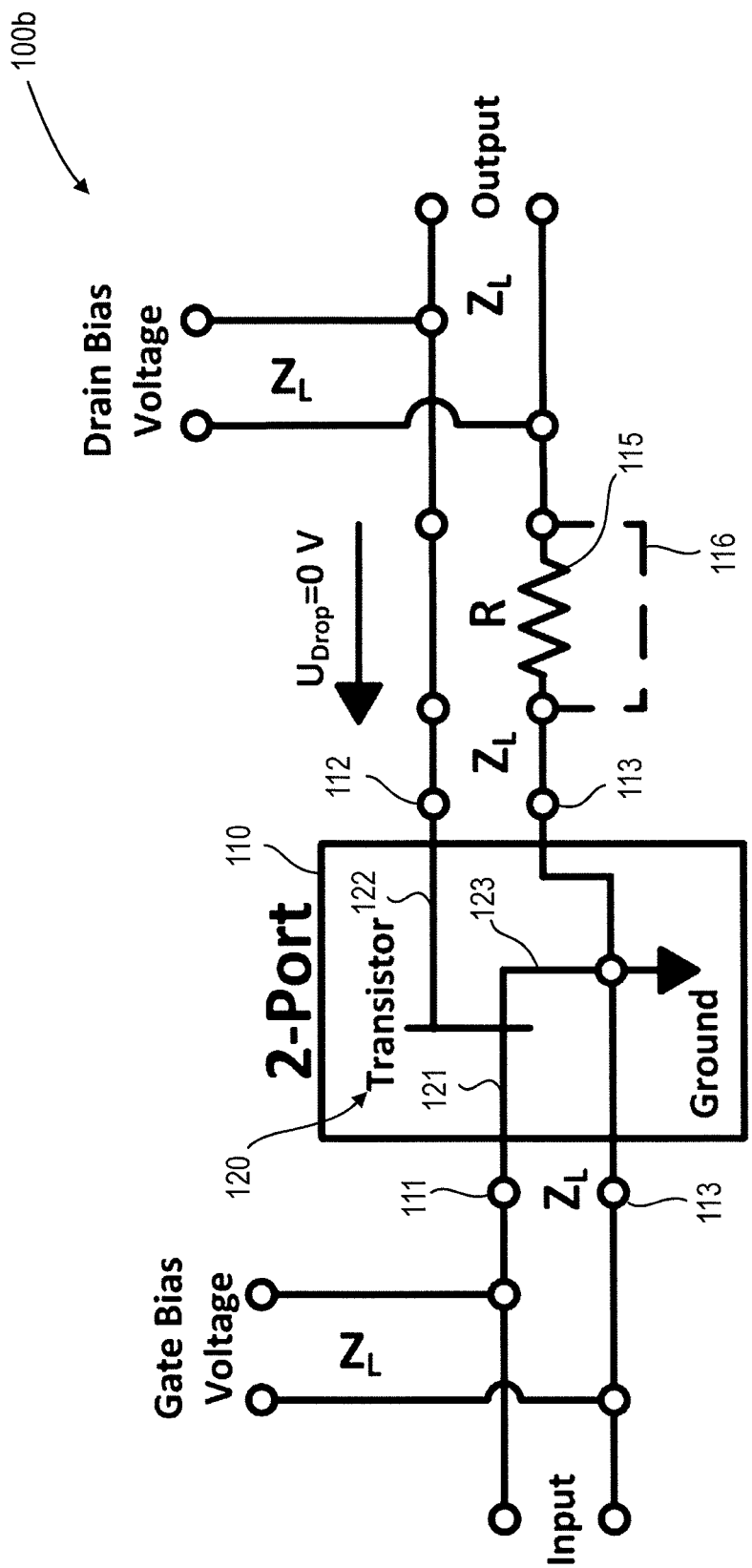
FIG. 5 shows a circuit diagram of a second embodiment of the proposed integrated semiconductor device including a transistor.

FIG. 5 shows a circuit diagram of a second embodiment of the integrated semiconductor circuit 100b including a transistor 120 a main element of the two-port 110. The transistor 120 comprises a gate 121, a drain 122 and a source 123. The source 123 is coupled to the ground terminal 113. The gain 121 and drain 122 are coupled to the first and second port terminals 111, 112, respectively, and are thus coupled to respective bias voltages.

Figures 6A, 6B:
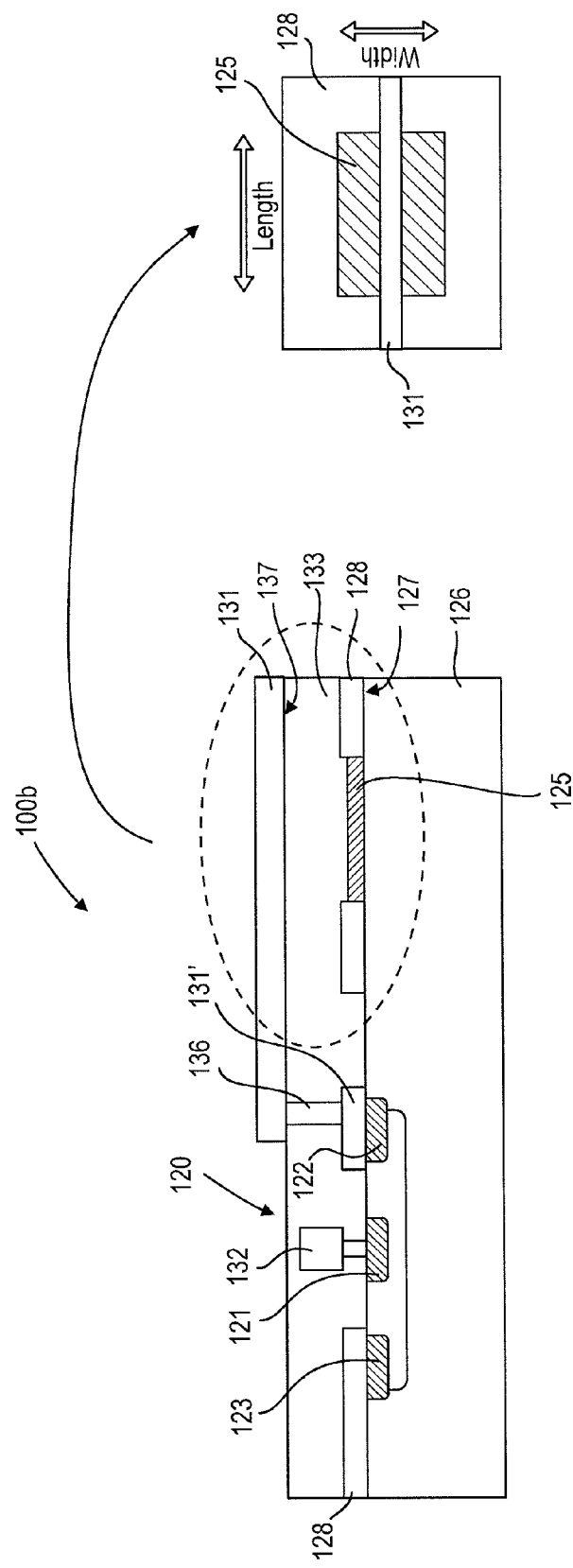
FIG. 6 shows a cross section and a top view of an implementation of the second embodiment of the proposed integrated semiconductor device shown in FIG. 5.

FIG. 6A shows a cross-section and FIG. 6B showing a detailed top-view of the circuit 100b shown in FIG. 5 as integrated semiconductor device (partly) using front side transmission line. The device comprises the transistor 120 having a drain 122, a gate 121 and a source 122, which is formed within a substrate layer 126 on a first side 127 of said substrate layer 126. The ground plane layer 128 is formed on the surface of the first side 127 of said substrate layer 126. Said ground plane layer 128 is in contact with the source 123 of said transistor 121 (in the common-source configuration shown here; for different configurations as common-drain or common-gate ground will be connected to drain or gate accordingly as shown and explained below). An insulating layer 133 is formed on the surface on the first side 127 of said substrate layer 126. A signal plane layer 131 is formed on a surface 137 of said insulating layer 131 facing away from said substrate layer 126. A via hole 136 is formed through said insulating layer 133 to electrically contact said signal plane layer 131 with said drain 122 of said transistor 121 through another part of the signal plane layer 131'. A gate terminal 132 is formed within said insulating layer 133 to electrically contact said gate 121 of said transistor 121. The resistor 125 is formed within said ground plane layer 128 on the surface 127 of said substrate layer 126.

As shown in the top view depicted in FIG. 6B the resistor 125 is formed as a plate on said surface, preferably having a rectangular shape having a length in the direction of signal flow and a width perpendicular to the direction of signal flow. Preferably, the length of the resistor 125 is larger than its width and the resistor 125 is surrounded by ground plane material 128. Further, the width of the signal plane layer 131 is smaller than the width of the resistor 125.

By changing the width and length of the resistor 125 and the absence of via holes (compared with the known embodiment shown in FIG. 3) more tuning range for the resistor value (especially for low resistance) is given as no clearance (based on individual process design rules) for e.g. via holes interconnects needs to be taken into account.

Figure 7:
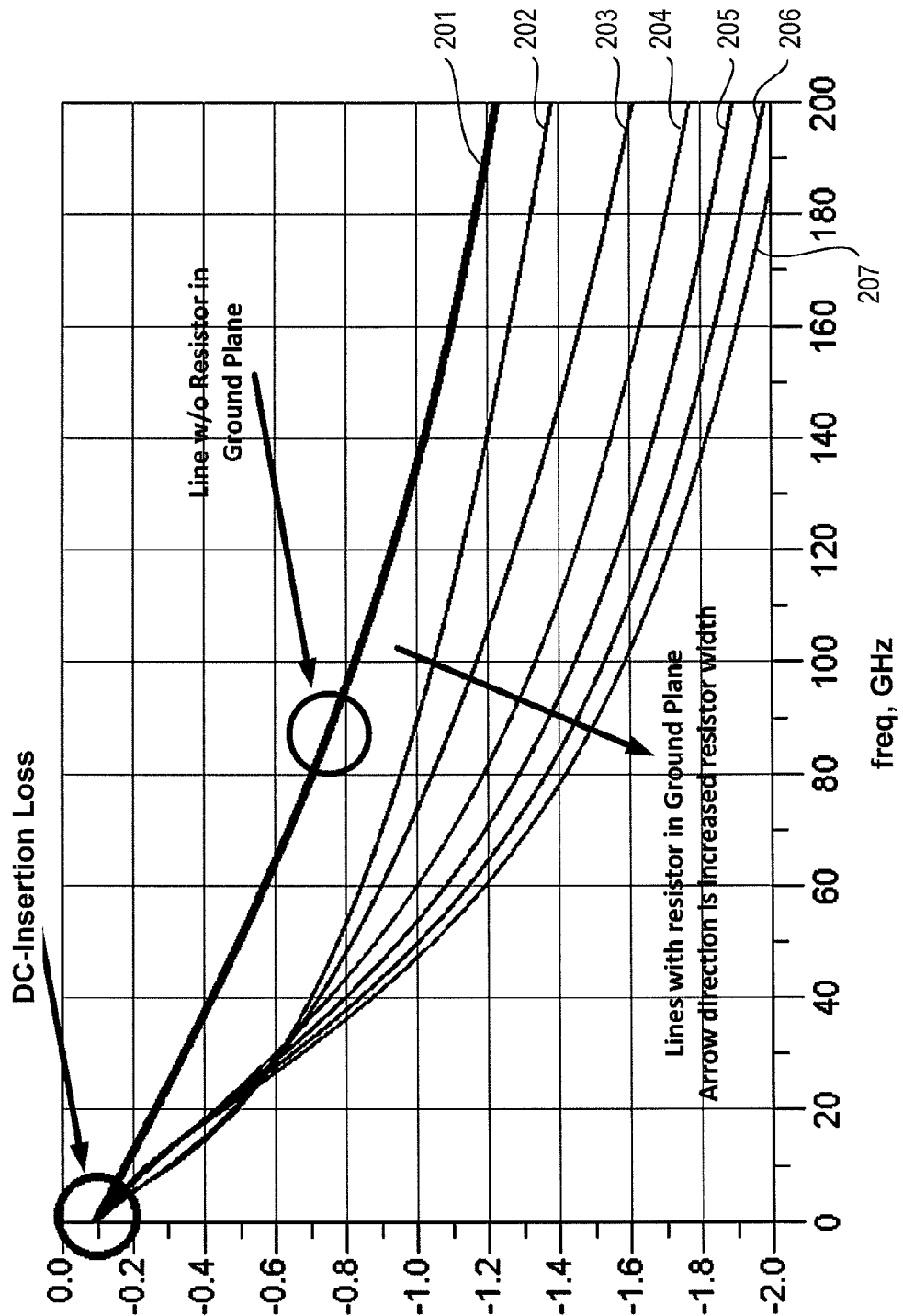
FIG. 7 shows a diagram illustrating the insertion losses of transmission lines with and without resistor implemented in the ground plane.

In FIG. 7 the insertion loss (dB/mm line length) versus frequency is shown. Graph 201 shows the insertion loss for a transmission line without a resistor in the ground plane layer, graphs 202 to 207 show the insertion loss for transmission lines with resistor in the ground plane layer, wherein the width of the resistor is varied and the length of the resistor is 1 mm for these calculations.

In other embodiments, the length of the resistor is shorter than its width. This has the effect that resistor values lower the sheet resistance can be realized which may be needed in certain applications.

Further, in principle any patch of resistive material is possible for the resistor. The shape is generally less important than the size of the area underneath the signal line. The resistive behavior of the patch can be also generated by e.g. defecting the ground metal area.

As it is visible from the chart shown in FIG. 7, the DC resistance of the different transmission lines is the same. On the other hand by adding a resistor within the ground plane layer (as explained) the insertion loss and so the improvement for stability in e.g. amplifier circuits can be influenced. In this case the resistor is designed to be best operational in the 100 GHz frequency range and above.

Figure 8:
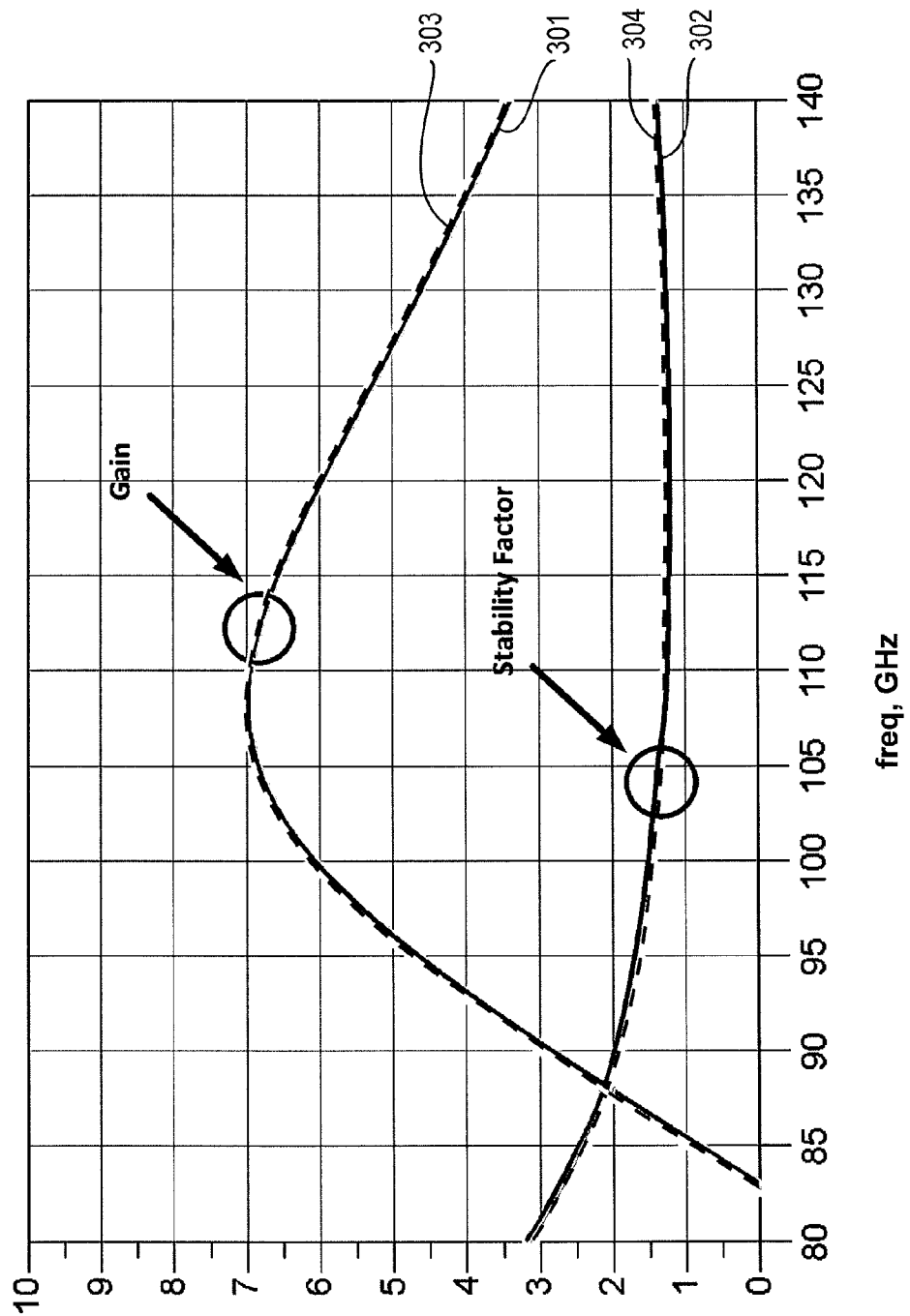
FIG. 8 shows a diagram illustrating the gain and stability performance for a single stage amplifier using a known measure and the proposed measure for stabilization.

In FIG. 8 the gain and stability performance for a single stage amplifier designed for 110 GHz operation frequency is shown. Graphs 301 and 302 (continuous lines) show the gain and stability performance for the known circuitry as shown in FIG. 1. Graphs 303 and 304 (broken lines) show the gain and stability performance for the proposed circuitry as shown in FIG. 5. In this specific example, the resistance value is 5 Ohm. Based on the results there is no difference observable between both circuitries which confirms the desired performance of the proposed integrated semiconductor device and the functionality of the invention.

Figure 9:
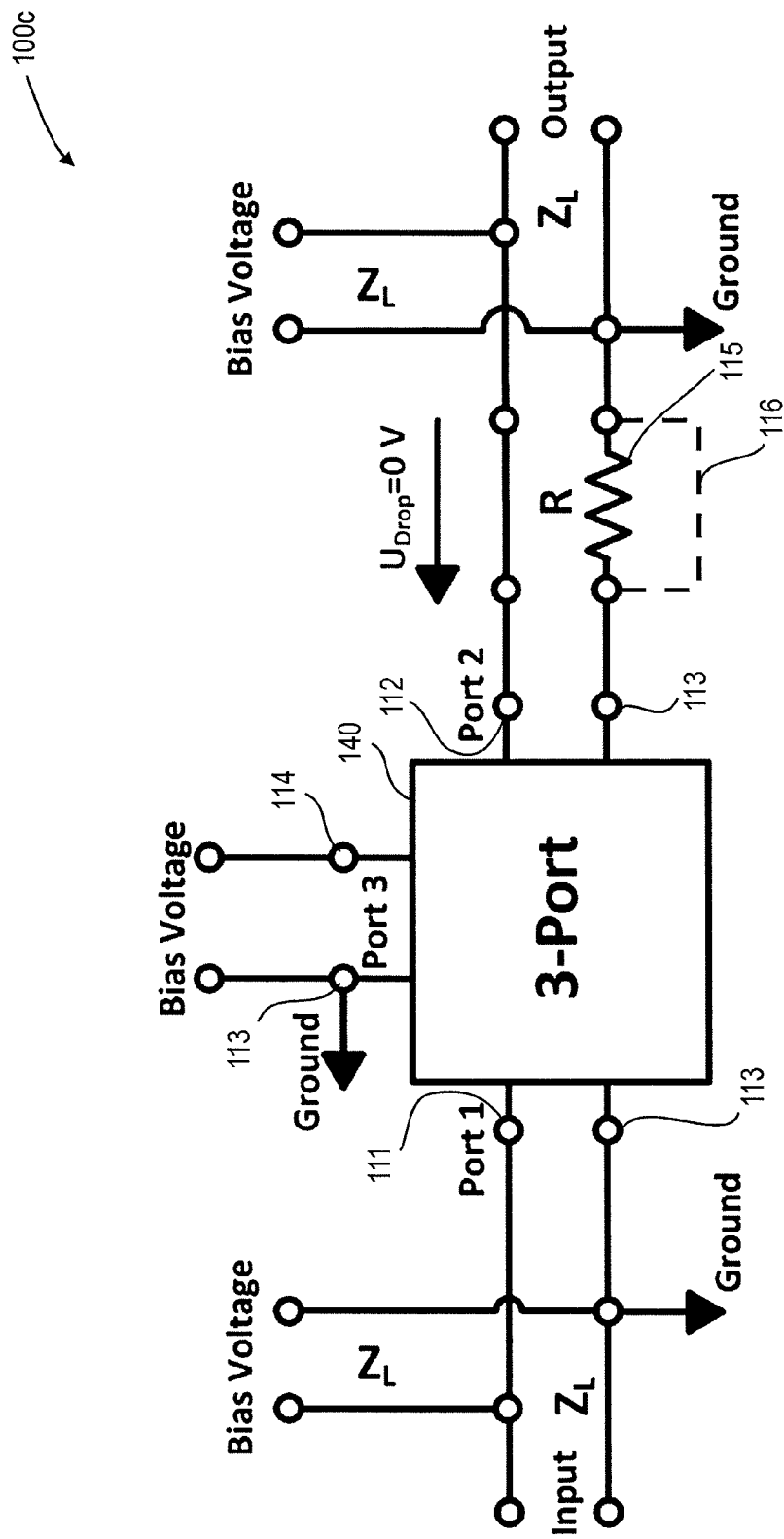
FIG. 9 shows a circuit diagram of a third embodiment of the proposed integrated semiconductor device including a three-port.

FIG. 9 shows a circuit diagram of a third embodiment of the proposed integrated semiconductor device 100c including a three-port 140. The three-port 140 comprises a first port terminal 111, a second port terminal 112, a third port terminal 114 and a ground terminal 113. Also between the third port terminal 114 and the ground terminal 113 a third bias voltage is provided.

Figure 10:
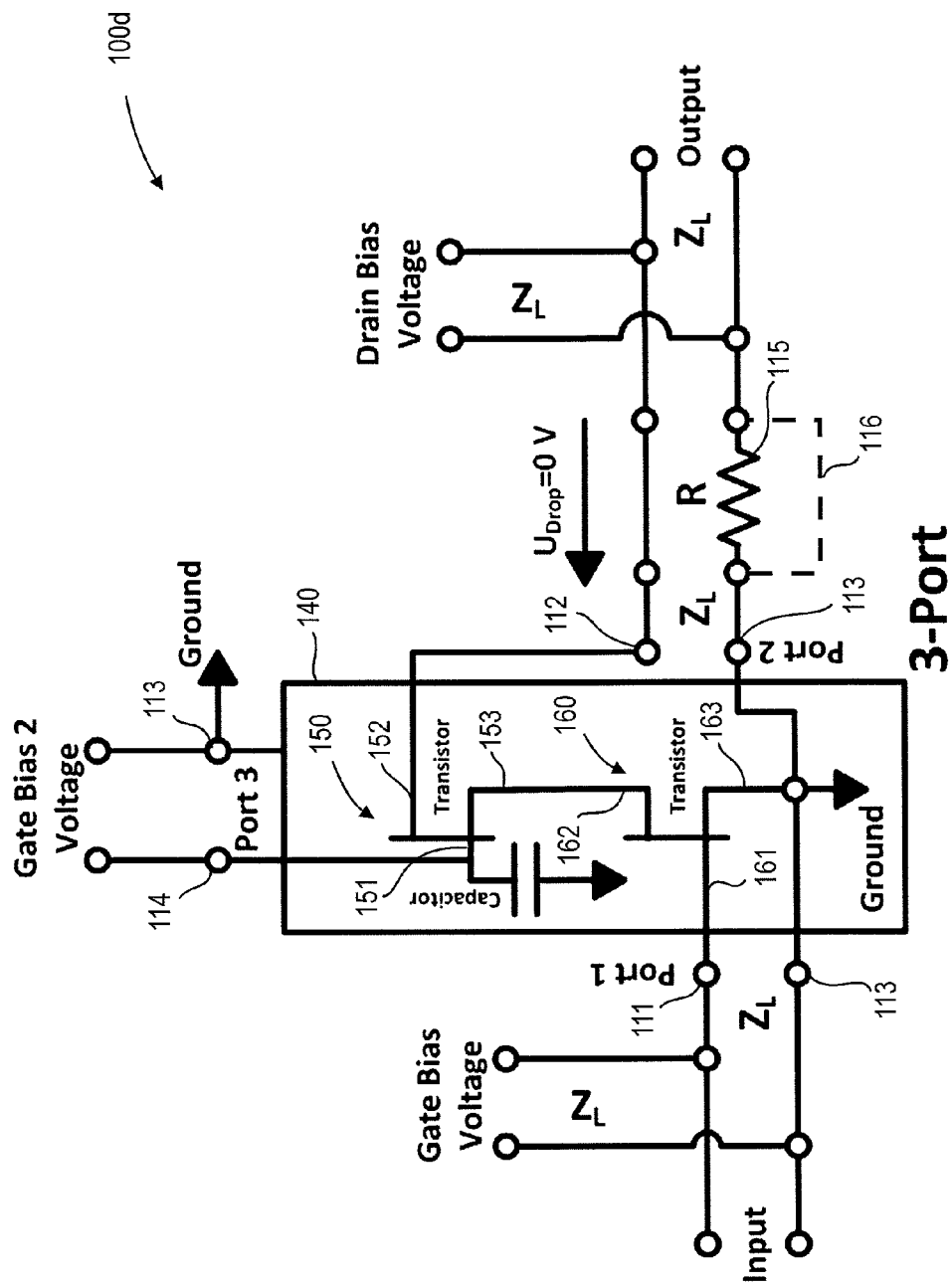
FIG. 10 shows a circuit diagram of a fourth embodiment of the proposed integrated semiconductor device including two transistors designed in a cascade configuration.

FIG. 10 shows a circuit diagram of a fourth embodiment of the proposed integrated semiconductor device 100d including a first transistor 150 and a second transistor 160 as main elements of the three-port 140. The circuit shown in FIG. 10 is a so called cascade configuration. Cascade configurations are known for higher gain, higher bandwidth, better input/output isolation and higher input/output impedance. The first transistor 150 comprises a gate 151, a drain 152 and a source 153, and the second transistor 160 comprises a gate 161, a drain 162 coupled to the source 153 of the first transistor 150 and a source 163. The gate 151 of the first transistor 150 is coupled to a capacitor 154 against ground and the third port terminal 114. The drain 152 of the first transistor 150 is coupled to the drain bias voltage. The gate of the second transistor 160 is coupled to the gate bias voltage. The source 163 of the second transistor 160 is coupled to ground.

Figure 11:
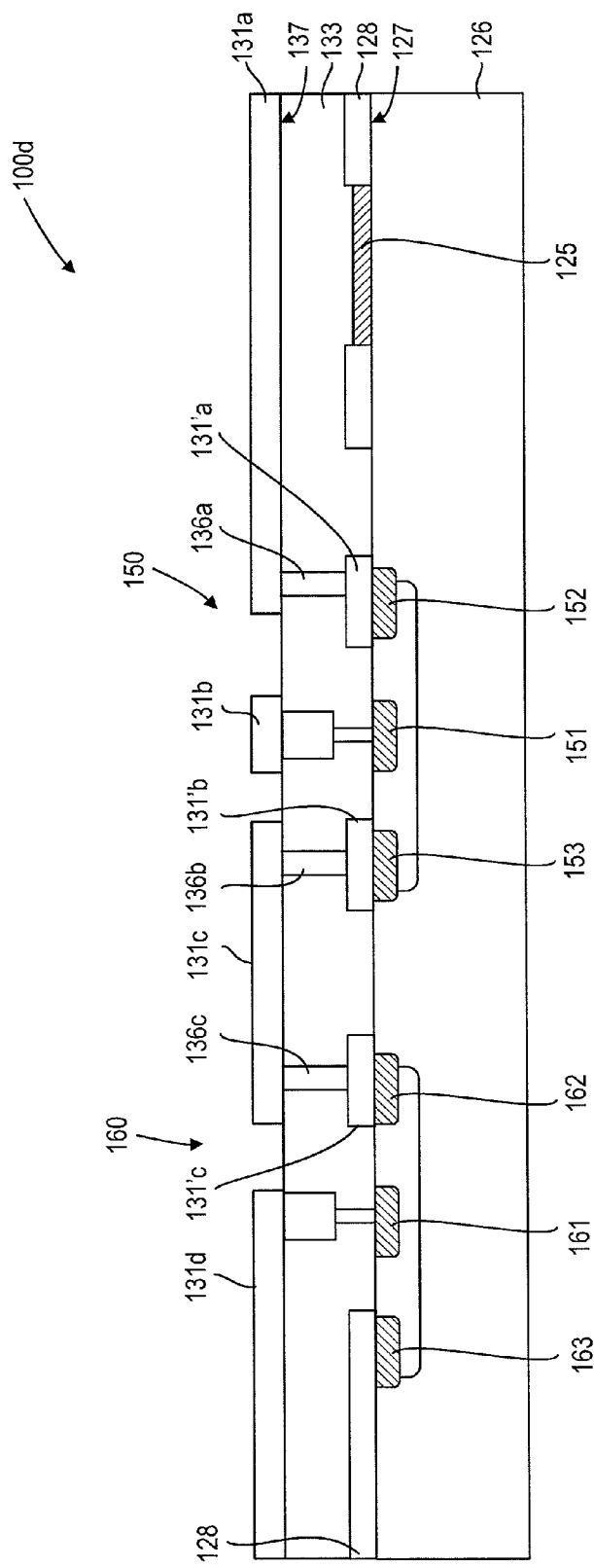
FIG. 11 shows a cross section and a top view of an implementation of the fourth embodiment of the proposed integrated semiconductor device shown in FIG. 10.

FIG. 11 shows a cross section of the fourth embodiment of the proposed integrated semiconductor device 100d shown in FIG. 10. The various terminals of the two transistors 160 are connected by various pieces 131a-d, 131'a-c of the signal plane layer and various via holes 136a-c.

Figure 12:
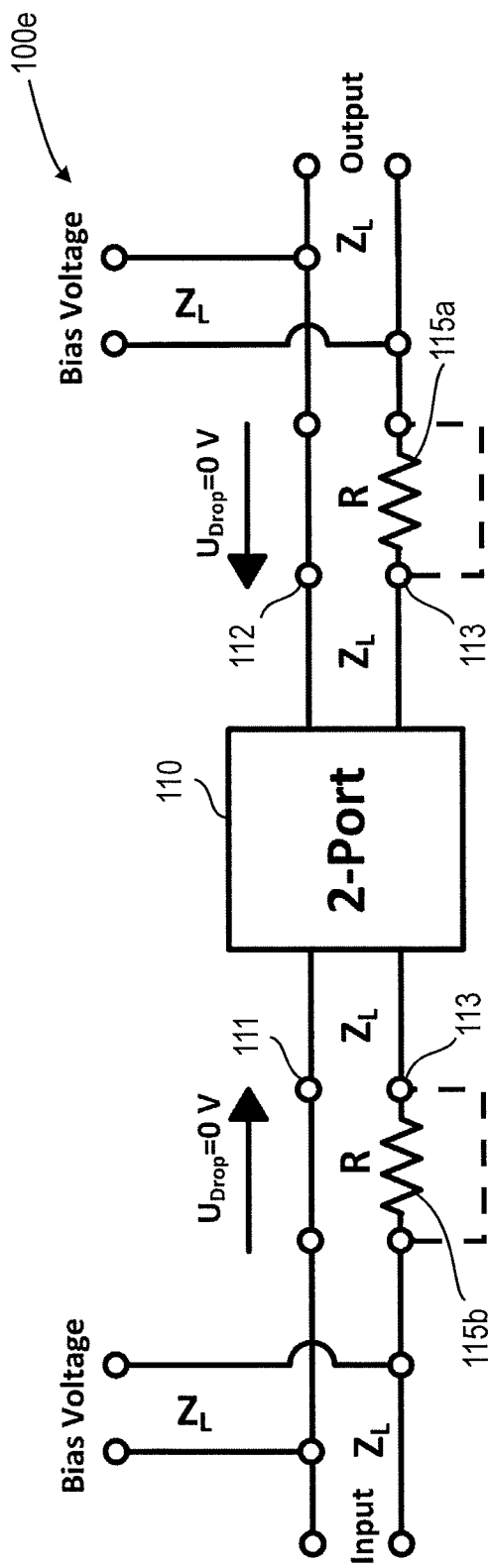
FIG. 12 shows a circuit diagram of a fifth embodiment of the proposed integrated semiconductor device including a two-port.

FIG. 12 shows a circuit diagram of a fifth embodiment of a semiconductor circuit 100e according to the present invention. This fifth embodiment is similar to the first embodiment shown in FIG. 4, but here comprises two resistors 115a, 115b. On each side of the two-pole 110 one of the resistors 115a, 115b is provided within the ground plane and coupled to the respective ground terminal 113. This provides, as needed in some applications, resistive loading at input and output to achieve stability.

The proposed integrated semiconductor device is configured to act as a high frequency (or microwave) amplifier, in particular in a frequency range above 100 GHz. Other applications are possible, for instance to use the proposed integrated semiconductor device as attenuator or power splitter having (substantially) no DC-resistance (a small DC-resistance due to conductivity of conductor can generally not be avoided).

Obviously, numerous modifications and variations of the present disclosure are possible in light of the above teachings. It is therefore to be understood that within the scope of the appended claims, the invention may be practiced otherwise than as specifically described herein.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. An integrated semiconductor device comprising:
   a substrate layer,
   an n-port, n being an integer equal to or larger than 2, having a first port terminal, a second port terminal and a ground terminal, said n-port being formed within said substrate layer on a first side of said substrate layer, an insulating layer formed on a surface on said first side of said substrate layer, a ground plane layer formed between said substrate layer and said insulating layer, said ground plane layer being in contact with one terminal of said n-port, a signal plane layer formed on a surface of said insulating layer facing away from said substrate layer, a via hole formed through said insulating layer and electrically contacting said signal plane layer with another terminal of said n-port than said ground plane layer, a terminal formed within said insulating layer and electrically contacting said terminal of said n-port that is neither in contact with said ground plane layer nor with said signal plane layer, and a resistor formed within said ground plane layer.

2. The integrated semiconductor device as claimed in claim 1, wherein said resistor is formed as a plate on said surface on said first side of said substrate layer.

3. The integrated semiconductor device as claimed in claim 2, wherein said resistor has a rectangular shape having a length in the direction of signal flow and a width perpendicular to the direction of signal flow.

4. The integrated semiconductor device as claimed in claim 3, wherein the length of said resistor is larger than its width.

5. The integrated semiconductor device as claimed in claim 3, wherein the length of said resistor is smaller than its width.

6. The integrated semiconductor device as claimed in claim 1, wherein said resistor is surrounded by ground plane material.

7. The integrated semiconductor device as claimed in claim 1, wherein the width of said signal plane layer is smaller than the width of said resistor.

8. The integrated semiconductor device as claimed in claim 1, wherein the integrated semiconductor device is configured to act as a high frequency amplifier, in particular in a frequency range above 100 GHz.

9. The integrated semiconductor device as claimed in claim 1, wherein said n-port comprises a transistor having a source, a gate and a drain, said transistor being formed within said substrate layer on a first side of said substrate layer, wherein said ground plane layer is in contact with said source, said gate or said drain of said transistor, wherein said via hole is electrically contacting said signal plane layer with said drain, said source or said gate of said transistor, and wherein said terminal is electrically contacting said the element of said transistor that is neither in contact with said ground plane layer nor with said signal plane layer.

10. An integrated semiconductor device as claimed in claim 9, wherein said ground plane layer is in contact with said source of said transistor and said via hole electrically contacts said signal plane layer with said drain of said transistor, and further comprising a gate terminal formed within said insulating layer and electrically contacting said gate of said transistor.

11. An integrated semiconductor device as claimed in claim 9, wherein said ground plane layer is in contact with said drain of said transistor and said via hole electrically contacts said signal plane layer with said source of said transistor, and further comprising a gate terminal formed within said insulating layer and electrically contacting said gate of said transistor.

12. An integrated semiconductor device as claimed in claim 9, wherein said ground plane layer is in contact with said gate of said transistor and said via hole electrically contacts said signal plane layer with said drain of said transistor, further comprising a source terminal formed within said insulating layer and electrically contacting said source of said transistor.

* * * * *